United States Patent
Lee et al.

(10) Patent No.: US 10,020,071 B2
(45) Date of Patent: Jul. 10, 2018

(54) TEST MODE SETTING CIRCUIT AND SEMICONDUCTOR DEVICE INCLUDING THE SAME

(71) Applicant: SK hynix Inc., Gyeonggi-do (KR)

(72) Inventors: Sang-Ho Lee, Gyeonggi-do (KR); Kyeong-Tae Kim, Gyeonggi-do (KR); Jae-Boum Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 198 days.

(21) Appl. No.: 15/090,278

(22) Filed: Apr. 4, 2016

(65) Prior Publication Data
US 2017/0169901 A1   Jun. 15, 2017

(30) Foreign Application Priority Data
Dec. 11, 2015  (KR) .................. 10-2015-0176812

(51) Int. Cl.
*G11C 29/14* (2006.01)
*G11C 29/36* (2006.01)
*G11C 29/08* (2006.01)
*G11C 29/54* (2006.01)
*G11C 29/38* (2006.01)
*G11C 29/44* (2006.01)
*G11C 29/50* (2006.01)
*G11C 29/46* (2006.01)

(52) U.S. Cl.
CPC .............. *G11C 29/36* (2013.01); *G11C 29/08* (2013.01); *G11C 29/14* (2013.01); *G11C 29/38* (2013.01); *G11C 29/44* (2013.01); *G11C 29/46* (2013.01); *G11C 29/50004* (2013.01); *G11C 29/54* (2013.01)

(58) Field of Classification Search
CPC .......... G11C 29/08; G11C 29/14; G11C 29/54
USPC ........................................... 365/201
See application file for complete search history.

(56) References Cited

U.S. PATENT DOCUMENTS

| 5,905,690 A | * | 5/1999 | Sakurai | ............ | G01R 31/31701 |
| | | | | | 365/201 |
| 2007/0171738 A1 | * | 7/2007 | Kim | ...................... | G11C 29/14 |
| | | | | | 365/201 |

FOREIGN PATENT DOCUMENTS

KR     100195976     6/1999
KR     1020150124521  11/2015

* cited by examiner

*Primary Examiner* — Hoai V Ho
*Assistant Examiner* — Jay Radke
(74) *Attorney, Agent, or Firm* — IP & T Group LLP

(57) ABSTRACT

A test mode setting circuit may include: a first test mode signal generation unit operated by a first supply voltage, and suitable for activating a first test mode signal at a first voltage level in a state where mode setting is being performed, the first test mode signal corresponding to a test code among a plurality of first test mode signals; and a second test mode signal generation unit operated by a second supply voltage, and suitable for latching the first test mode signal at a second voltage level and generating the latched first test mode signal as a second test mode signal even when the first supply voltage is deactivated to a third supply voltage lower than the first supply voltage.

20 Claims, 4 Drawing Sheets

TEST MODE SETTING CIRCUIT AND SEMICONDUCTOR DEVICE INCLUDING THE SAME

CROSS-REFERENCE TO RELATED APPLICATIONS

The present application claims priority of Korean Patent Application No. 10-2015-0176812, filed on Dec. 11, 2015, which is incorporated herein by reference in its entirety.

BACKGROUND

1. Field

Exemplary embodiments of the present invention relate to a test mode setting circuit and a semiconductor device including the same.

2. Description of the Related Art

A semiconductor device may include a test mode setting circuit for setting a test mode and then selecting a test operation among a plurality of test operations. Furthermore, the semiconductor device may include a plurality of test circuits corresponding to the plurality of test operations. When a test operation is selected, the semiconductor device may enable the corresponding test circuit to perform the selected test operation. The test mode may indicate a specific operation mode which is set for the semiconductor device to perform a test operation.

FIG. 1 is a block diagram illustrating a test mode setting circuit 100. FIG. 2 is a waveform diagram for illustrating the operation of the test mode setting circuit 100 of FIG. 1.

Referring to FIG. 1, the test mode setting circuit 100 may set a test mode corresponding to a test code TM_CODE among a plurality of test modes, in response to the test code TM_CODE. Each of the test modes may correspond to a test mode signal among a plurality of test mode signals TM1 to TMn.

Referring to FIG. 2, the test mode setting circuit 100 may set a test mode corresponding to the test code TM_CODE among the plurality of test modes, when mode setting is being performed (starting at SET1) or when a setting signal MRS_SET is activated. The test mode setting circuit 100 may activate a test mode signal corresponding to the set test mode among the plurality of test mode signals TM1 to TMn. That is, a test mode signal TMx may be activated, wherein x is a natural number having the following relationship of 1≤x≤n. The activated test mode signal TMx may be deactivated when a supply voltage VDD starts to be reset (VDD_RESET). The VDD_RESET represents a time point when supply voltage VDD is deactivated to a ground voltage VSS.

Only when the mode setting is being performed, the test mode setting circuit 100 can then set a test mode. Thus, the test mode setting circuit 100 cannot set a test mode during a period A until mode setting is being performed (starting at SET2) after the supply voltage VDD is being reset (VDD_RESET). For reference, the reset operation may include reactivating the supply voltage after the supply voltage is deactivated.

SUMMARY

Various embodiments are directed to a test mode setting circuit which is capable of maintaining the state of an activated test mode signal regardless of reset of a supply voltage and setting a test mode to perform a test mode before mode setting is completed after the supply voltage is reset, and a semiconductor device including the same.

In an embodiment, a test mode setting circuit may include: a first test mode signal generation unit operated by a first supply voltage, and suitable for activating a first test mode signal at a first voltage level in a state where mode setting is being performed, the first test mode signal corresponding to a test code among a plurality of first test mode signals; and a second test mode signal generation unit operated by a second supply voltage, and suitable for latching the first test mode signal at a second voltage level and generating the latched first test mode signal as a second test mode signal even when the first supply voltage is deactivated to a ground voltage VSS.

In an embodiment, a semiconductor device may include: a mode register set circuit suitable for setting and storing an operation mode of the semiconductor device in response to a command and address, and activating a setting signal when the setting is being performed; a first test mode signal generation unit operated by a first supply voltage, and suitable for activating a first test mode signal at a first voltage level in a state where the setting signal is activated, the first test mode signal corresponding to a test code among a plurality of first test mode signals; a second test mode signal generation unit operated by a second supply voltage, suitable for latching the first test mode signal at a second voltage level and generating the latched first test mode signal as a second test mode signal when a first supply voltage is deactivated to a third supply voltage lower than the first supply voltage; and an internal circuit suitable for performing a predetermined operation corresponding to the second test mode signal when the second test mode signal is activated.

In an embodiment, a semiconductor device may include: a mode register set circuit suitable for setting an operation mode of the semiconductor device in response to a command and address; a test mode setting circuit suitable for setting a test mode corresponding to a test code among a plurality of test modes after the setting of the operation mode has been completed, and maintaining the set test mode even when a first supply voltage is deactivated to a third supply voltage lower than the first supply voltage; and an internal circuit suitable for performing a predetermined operation corresponding to one or more test modes among the plurality of test modes, when the one or more test modes are set.

DETAILED DESCRIPTION

Figure 1:
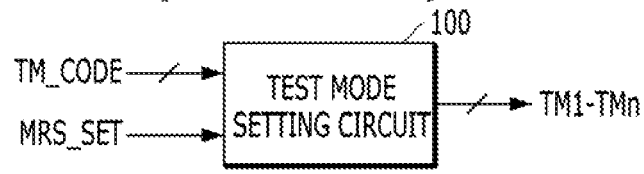
FIG. 1 is a block diagram illustrating a test mode setting circuit 100.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

Figure 3:
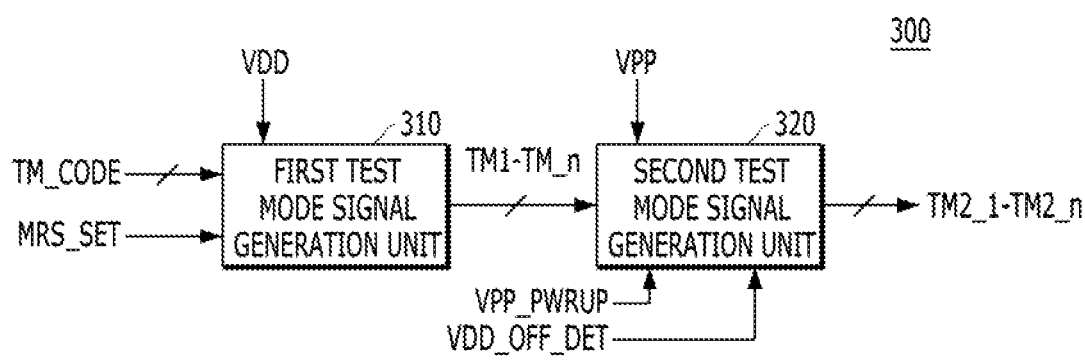
FIG. 3 is a block diagram of a test mode setting circuit in accordance with an embodiment of the present invention.

Referring now to FIG. 3 a test mode setting circuit 300 is provided, in accordance with an embodiment of the present invention.

Referring to FIG. 3, the test mode setting circuit 300 may include a first and a second test mode signal generation units 310 and 320.

The first test mode signal generation unit 310 may be operated by a first supply voltage VDD. The first test mode signal generation unit 310 may activate a first test mode signal to a first voltage level in a state where mode setting is being performed or a setting signal MRS_SET is activated. The first test mode signal may be corresponding to a test code TM_CODE among a plurality of first test mode signals TM1_1 to TM1_n. The first voltage level may correspond to the voltage level of the first supply voltage VDD. The first supply voltage VDD may be a main supply voltage used in the test mode setting circuit 300 and a semiconductor device including the setting circuit 300.

When mode setting is not being performed or when the setting signal MRS_SET is deactivated, the first test mode signal generation unit 310 may maintain the state in which all of the test mode signals TM1_1 to TM1_n are deactivated, regardless of the test code TM_CODE. That is, the first test mode signal generation unit 310 may not set a test mode, when mode setting is not being performed.

The second test mode signal generation unit 320 may be operated by a second supply voltage VPP. The second test mode signal generation unit 320 may generate a plurality of second test mode signals TM2_1 to TM2_n corresponding to the respective first test mode signals TM_1 to TM1_n. The second test mode signal generation unit 320 may shift the voltage level of the first test mode signal activated at the first voltage level to a second voltage level, and may activate a second test mode signal corresponding to the activated first test mode signal at the second voltage level. The second test mode signal generation unit 320 may maintain the state of the second test mode signal activated at the second voltage level while the second supply voltage VPP is retained.

The second supply voltage VPP may be a supply voltage which has a higher voltage level than the main supply voltage used in the test mode setting circuit 300 and the semiconductor device including the same. Since the second test mode signal generation unit 320 does not use the first supply voltage VDD, the second test mode signal generation unit 320 may be normally operated when the second supply voltage VPP maintains the active state, while the first power supply voltage VDD is being reset. A reset operation of the first power supply voltage VDD is performed from when the first power supply voltage VDD is deactivated to a ground voltage level VSS to when the first power supply voltage VDD is activated to the first voltage level VDD. That is, the second test mode signal generation unit 320 may be normally operated when the second supply voltage VPP maintains the active state, even though the reset operation of the first power supply voltage VDD is performed. The second test mode signal generation unit 320 may deactivate all of the activated second test mode signals when the second supply voltage VPP is deactivated to a ground voltage VSS.

Figure 4:
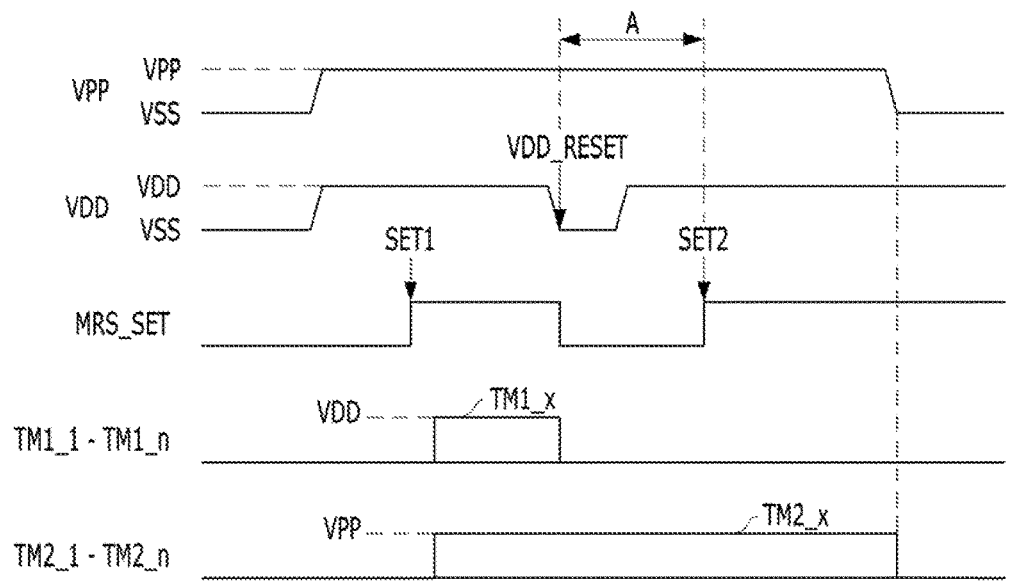
FIG. 4 is a waveform diagram illustrating an operation of the test mode setting circuit of FIG. 3.

Referring now to the waveform diagram of FIG. 4, an operation of the test mode setting circuit 300 of FIG. 3 will be described.

Accordingly, the test mode setting circuit 300 may activate a first test mode signal at the first voltage level VDD when mode setting is being performed (starting at SET1) or when the setting signal MRS_SET is activated. The first test mode signal may correspond to the test code TM_CODE among the plurality of first test mode signals TM1_1 to TM1_n. FIG. 4 illustrates the case in which a first test mode signal TM1_x among the plurality of first test mode signals TM1_1 to TM1_n is activated.

The second test mode signal generation unit 320 may activate a second test mode signal TM2_x at the second voltage level VPP, the second test mode signal TM2_x corresponding to the activated first test mode signal TM1_x among the plurality of second test mode signals TM2_1 to TM2_n. Since the second test mode signal generation unit 320 is operated by the second supply voltage VPP, the active state of the second test mode signal TM2_x may be maintained during a period A until mode setting is being performed again (starting at SET2) after the first supply voltage VDD starts to be reset (VDD_RESET). The VDD_RESET represents a time point when supply voltage VDD is deactivated to a ground voltage VSS.

Figure 2:
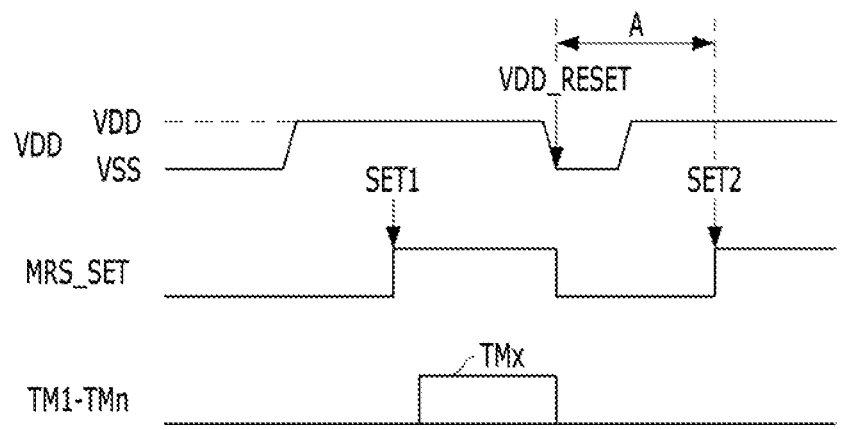
FIG. 2 is a waveform diagram illustrating an operation of the test mode setting circuit 100 of FIG. 1.

Thus, the test mode setting circuit 300 of FIG. 3 can maintain the test mode setting state even during the period A in which the test mode could not be set in FIG. 2 when the set test mode was not canceled after the first mode setting was completed. Thus, the test mode setting circuit 300 can set a test mode to perform a test operation, even during a period in which the test mode could not be set.

Figure 5:
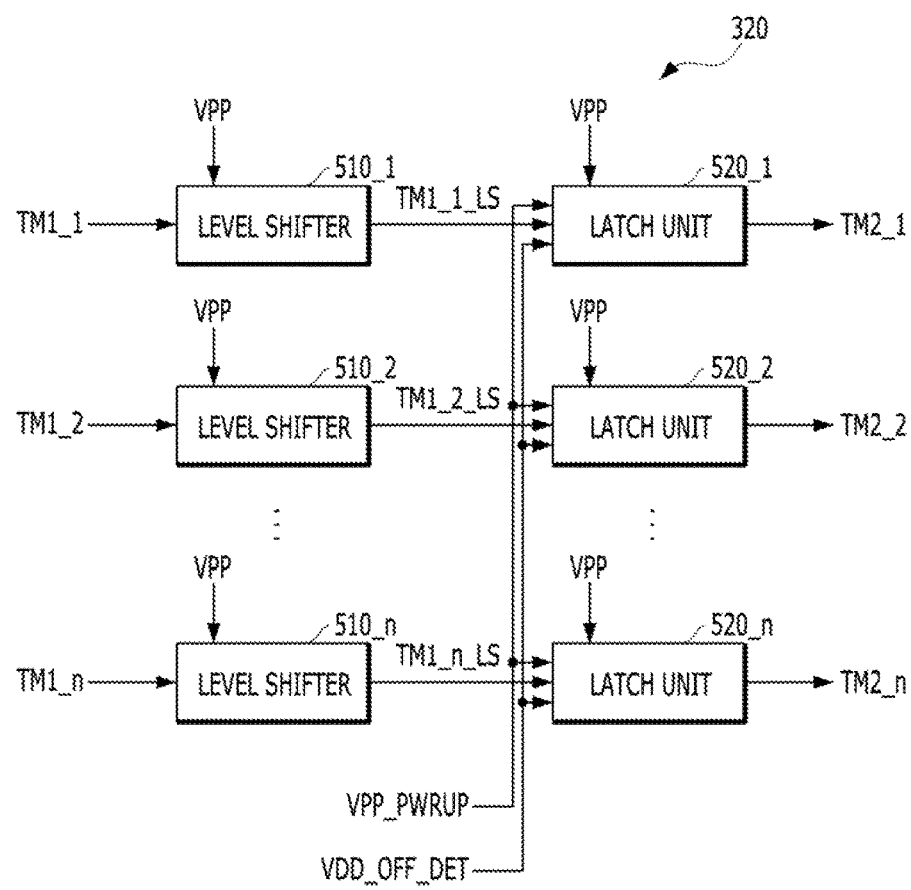
FIG. 5 is a block diagram of an example of a configuration of the second test mode signal generation unit of the test mode circuit of FIG. 3.

FIG. 5 is a block diagram of the second test mode signal generation unit 320 of FIG. 3.

Referring to FIG. 5, the second test mode signal generation unit 320 may include a plurality of level shifters 510_1 to 510_n and a plurality of latch units 520_1 to 520_n.

The plurality of level shifters 510_1 to 510_n may be operated by the second supply voltage VPP. When a corresponding first test mode signal among the plurality of first test mode signals TM1_1 to TM1_n is activated, each of the level shifters 510_1 to 510_n may generate a corresponding second test mode signal by shifting the level of the first test mode signal from the first voltage level VDD to the second voltage level VPP. The plurality of level shifters 510_1 to 510_n may correspond to the plurality of first test mode signals TM1_1 to TM1_n and the plurality of second test mode signals TM2_1 to TM2_n, respectively. Each of the level shifters 510_1 to 510_n may shift the level of the corresponding first test mode signal, and output the shifted signal as the corresponding second test mode signal. Since the plurality of level shifters 510_1 to 510_n are operated by the second supply voltage VPP, the plurality of level shifters 510_1 to 510_n may not be affected by the deactivation of the first supply voltage VDD. For reference, TM1_1_LS to TM1_n_LS may represent outputs of the plurality of level shifters 510_1 to 510_n, respectively, which are signals obtained by shifting the levels of the first test mode signals.

Each of the latch units 520_1 to 520_n may be operated by the second supply voltage VPP. Each of the latch units 520_1 to 520_n may latch a corresponding second test mode signal among the plurality of second test mode signals, and maintain the state of the latched second test mode signal while the second supply voltage VPP is retained. That is, the plurality of latch units 520_1 to 520_n may maintain the state of the corresponding second test mode signals even though the first supply voltage VDD is deactivated. When the second supply voltage VPP is deactivated, the plurality of latch units 520_1 to 520_n may deactivate the corresponding second test mode signals.

In FIG. 5, VPP_PWRUP represents a second supply voltage power-up signal which is activated when the second supply voltage VPP is stabilized, and VDD_OFF_DET represents a first supply voltage off detection signal which is activated during a predetermined period when deactivation of the first supply voltage VDD is detected. The signals and the operations of the latch units 520_1 to 520_n will be described below with reference to FIG. 6.

Figure 6:
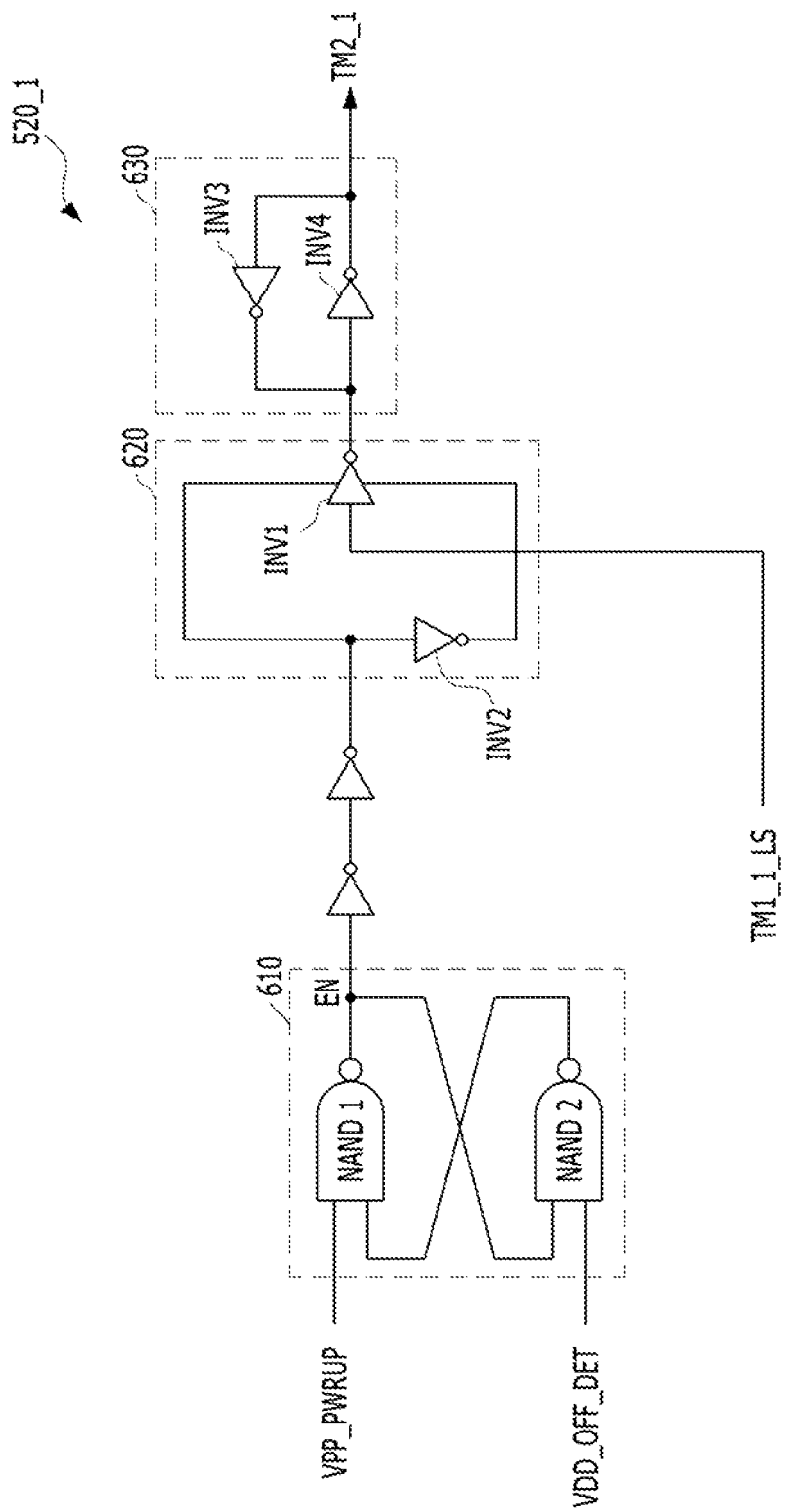
FIG. 6 is a circuit diagram of a latch unit employed in the second test mode signal generation unit of FIG. 5.

FIG. 6 is a circuit diagram of the latch unit 520_1 of FIG. 5.

Referring to FIG. 6, the latch unit 520_1 may include an RS latch 610, a signal transfer unit 620, and a latch 630.

The RS latch 610 may generate a control signal EN for controlling the signal transfer unit 620, in response to the second supply voltage power-up signal VPP_PWRUP and the first supply voltage off detection signal VDD_OFF_DET. The RS latch 610 may activate the control signal EN when the second supply voltage power-up signal VPP_PWRUP is activated, and deactivate the control signal EN when the first supply voltage off detection signal VDD_OFF_DET is activated. For this operation, the RS latch 610 may include first and second NAND gates NAND1 and NAND2.

The signal transfer unit 620 may include inverters INV1 and INV2 which invert and output an input TM1_1_LS when the control signal EN is activated, and block an input TM1_1_LS when the control signal EN is deactivated.

The latch 630 may include two inverters INV3 and INV4. The latch 630 may latch and output a signal TM2_1 which is inputted while the second supply voltage VPP maintains the active state.

Since the gates NAND1 and NAND2 and the inverters INV1 to INV4 of FIG. 6 are operated by the second supply voltage VPP, the gates NAND1 and NAND2 and the inverters INV1 to INV4 may be normally operated even though the first supply voltage VDD is deactivated.

FIG. 6 illustrates only the configuration and operation of the first latch unit 520_1. However, the other latch units 520_2 to 520_n may be configured and operated in the same manner as the latch unit 520_1 illustrated in FIG. 6.

Figure 7:
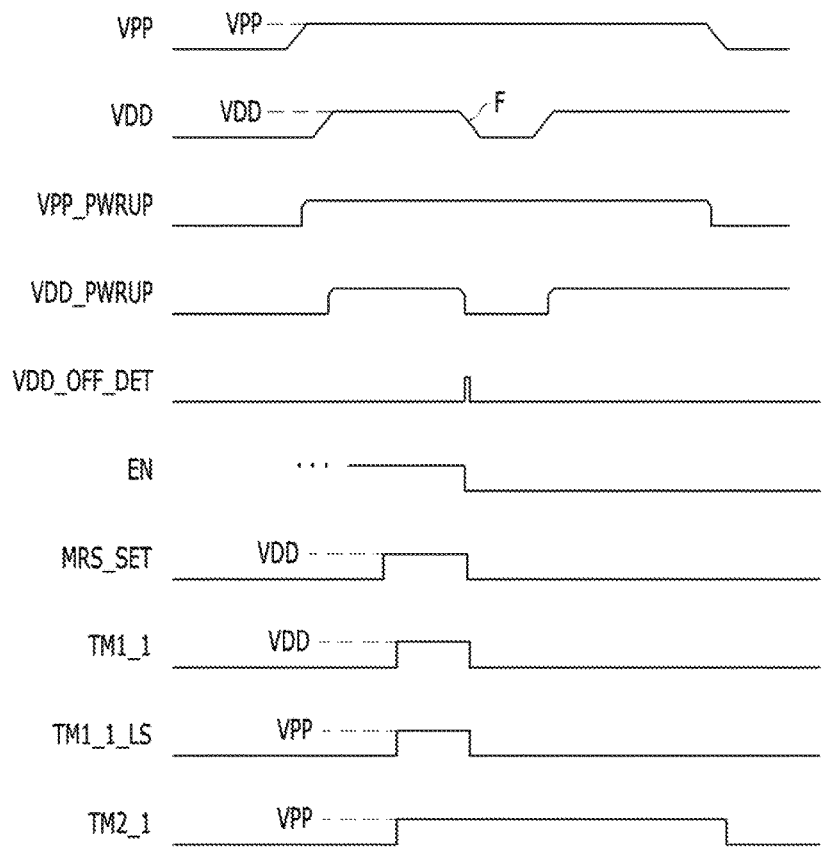
FIG. 7 is a waveform diagram for illustrating the operation of the latch unit 520_1 of FIG. 6.

Referring now to the waveform diagram of FIG. 7 an operation of the latch unit 520_1 will be described.

According to FIG. 7, the first supply voltage power-up signal VDD_PWRUP may be activated when the first supply voltage VDD reach a predetermined voltage level, and deactivated when the voltage level of the first supply voltage VDD falls below the predetermined voltage level so that the first supply voltage VDD is deactivated. The second supply voltage power-up signal VPP_PWRUP may be activated when the second supply voltage VPP is stabilized to a predetermined voltage level, and deactivated when the voltage level of the second supply voltage VPP falls below the predetermined voltage level so that the second supply voltage VPP is deactivated.

The first supply voltage off detection signal VDD_OFF_DET may be activated during a predetermined period when the first supply voltage VDD is deactivated. For example, the first supply voltage off detection signal VDD_OFF_DET may be activated during a predetermined period, in response to an inactive edge F of the first supply voltage power-up signal VDD_PWRUP. When the first supply voltage off detection signal VDD_OFF_DET is deactivated, the first supply voltage off detection signal VDD_OFF_DET may have a low level. When the first supply voltage off detection signal VDD_OFF_DET is activated, the first supply voltage off detection signal VDD_OFF_DET may have a high level.

When both of the first supply voltage power-up signal VDD_PWRUP and the first supply voltage off detection signal VDD_OFF_DET maintain a high level after the first and second supply voltages VDD and VPP reach to predetermined levels, the control signal EN may maintain the active state (e.g., high level). Thus, the signal TM1_1_LS outputted from the level shifter 510_1 may be latched by the latch 630 and outputted as the second test mode signal TM2_1. Then, after the first supply voltage off detection signal VDD_OFF_DET is activated to a low level, the control signal EN may be deactivated to block the output signal TM1_1_LS, and the second test mode signal TM2_1 may be maintained as a value at the point of time when the control signal EN is deactivated. Then, when the second supply voltage power-up signal VPP_PWRUP is deactivated, the second test mode signal TM2_1 may be deactivated.

Figure 8:
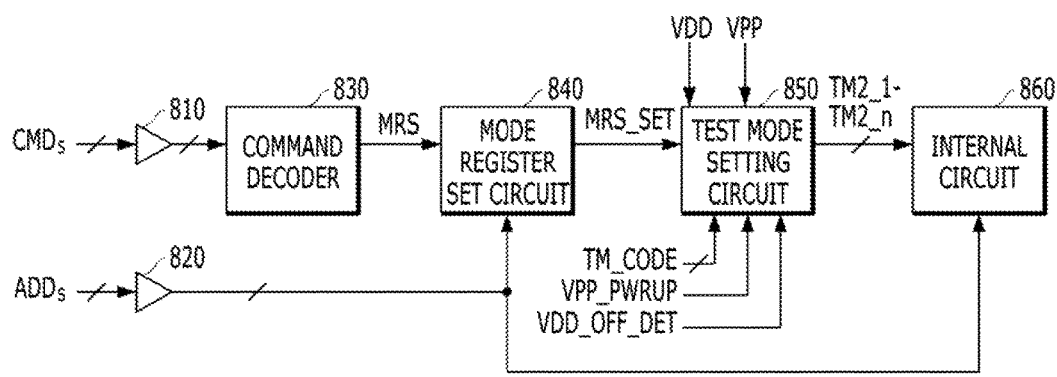
FIG. 8 is a block diagram of a semiconductor device in accordance with an embodiment of the present invention.

FIG. 8 is a block diagram of a semiconductor device in, accordance with an embodiment of the present invention.

Referring to FIG. 8, the semiconductor device may include a command input unit 810, an address input unit 820, a command decoder 830, a mode register set circuit 840, a test mode setting circuit 850, and an internal circuit 860. The test mode setting circuit 850 may include the test mode setting circuit of FIG. 3.

The command input unit 810 may receive commands CMDs, and the address input unit 820 may receive addresses ADDs. The commands CMDs and the addresses ADDs may include multi-bit signals.

The command decoder 830 may generate a mode setting command MRS in response to the command signals CMDs inputted through the command input unit 810. The command decoder 830 may activate the mode setting command MRS when a combination of the input command signals CMDs corresponds to the mode setting command MRS. In addition, the command decoder 830 may generate commands, such as active, read, and write commands by decoding the input command signals CMDs. However, since those commands have no direct relation to the memory in accordance with the embodiment of the present invention, the illustrations and descriptions thereof are omitted herein.

When the mode setting command MRS is activated, the mode register set circuit 840 may set and store an operation mode of the semiconductor device in response to the command signals CMDs inputted to the command input unit 810 and the address signals ADDs inputted to the address input unit 820. The mode register set circuit 840 may have data for controlling various modes of the semiconductor device according to the Joint Electronic Device Engineering Council (JDEC), and operations modes, such 'CAS latency', 'burst length', 'burst sequence', 'test mode', and 'vender special option' according to the value of the MRS (Mode Resister Set). The mode register set circuit 840 may activate the setting signal MRS_SET when the mode setting is being performed. The setting of the operation mode may be performed whenever the first supply voltage VDD is deactivated.

The test mode setting circuit 850 may set a test mode of the semiconductor device, and output the plurality of second test mode signals TM2_1 to TM2_n to operate the semiconductor device in the set test mode. The test mode setting circuit 850 may be operated by the first and second supply voltages VDD and VPP. The test mode setting circuit 850 may set a test mode corresponding to the test mode TM_CODE among the test modes, after the setting of the first operation mode has been completed. Then, the set test mode may be maintained even though the first supply voltage VDD is deactivated. The test mode setting circuit 850 may cancel the set test mode when the second supply voltage VPP is deactivated. For reference, the test code TM_CODE may indicate a code for selecting a test operation which is to be performed by the semiconductor device, and may be generated through a combination of the command signals CMDs inputted to the command input unit 810 and the address signals ADDs inputted to the address input unit 820.

The internal circuit 860 may perform an operation corresponding to one or more set test modes among the plurality of test modes. That is, the internal circuit 860 may perform an operation corresponding to one or more activated second test mode signals among the plurality of second test mode signals TM2_1 to TM2_n.

After a test mode is first set, the semiconductor device in accordance with an embodiment of the present invention may perform the set test mode operation from the point of time that the first supply voltage VDD is deactivated to the point of time that mode setting is being performed, which makes it possible to test how the semiconductor device is operated at various periods.

In accordance with an embodiment of the present invention, the test mode setting circuit can maintain the state of an activated test mode signal and set a test mode before mode setting is being performed. Thus, the test mode setting circuit can perform a test operation before the mode setting is being performed.

Although various embodiments have been described for illustrative purposes, it will be apparent to those skilled in the art that various changes and modifications may be made without departing from the spirit and or scope of the invention as defined in the following claims.

What is claimed is:

1. A test mode setting circuit comprising:
a first test mode signal generation unit operated by a first supply voltage, and configured to activate a first test mode signal at a first voltage level in a state where mode setting is being performed, the first test mode signal corresponding to a test code among a plurality of first test mode signals; and
a second test mode signal generation unit operated by a second supply voltage, and configured to latch the first test mode signal at a second voltage level and generate the latched first test mode signal as a second test mode signal even when the first supply voltage is deactivated to a third supply voltage lower than the first supply voltage.

2. The test mode setting circuit of claim 1, wherein the second test mode signal generation unit comprises:
a plurality of level shifters operated by the second supply voltage, each level shifter configured to generate a corresponding second test mode signal among a plurality of second test mode signals by shifting the level of a corresponding first test mode signal from the first voltage level to the second voltage level, when the corresponding first test mode signal among the plurality of first test mode signals is activated; and
a plurality of latch units operated by the second supply voltage, each latch unit configured to latch a corresponding second test mode signal among the plurality of second test mode signals.

3. The test mode setting circuit of claim 2, wherein the first supply voltage comprises a supply voltage having the first voltage level, the second supply voltage comprises a supply voltage having the second voltage level, and the second voltage level is higher than the first voltage level.

4. The test mode setting circuit of claim 2, wherein the mode setting comprises mode register set (MRS) setting.

5. The test mode setting circuit of claim 2, wherein each of the latch units maintains the state of the corresponding second test mode signal even when the first supply voltage is deactivated.

6. The test mode setting circuit of claim 2, wherein each of the latch units deactivates the corresponding second test mode signal when the second supply voltage is deactivated.

7. The test mode setting circuit of claim 2, wherein the first test mode signal generation unit maintains all of the first test mode signals in an inactive state, when the mode setting is not completed.

8. A semiconductor device comprising:
a mode register set circuit configured to set and store an operation mode of the semiconductor device in response to a command and address, and activate a setting signal when the setting is being performed;
a first test mode signal generation unit operated by a first supply voltage, and configured to activate a first test mode signal at a first voltage level in a state where the setting signal is activated, the first test mode signal corresponding to a test code among a plurality of first test mode signals;
a second test mode signal generation unit operated by a second supply voltage, configured to latch the first test mode signal at a second voltage level and generate the latched first test mode signal as a second test mode signal when the first supply voltage is deactivated to a third supply voltage lower than the first supply voltage; and
an internal circuit configured to perform a predetermined operation corresponding to the second test mode signal when the second test mode signal is activated.

9. The semiconductor device of claim 8, the second test mode signal generation unit comprises:
a plurality of level shifters operated by the second supply voltage, each configured to generate the second test mode signal by shifting the level of a corresponding first test mode signal from the first voltage level to a second voltage level, when the corresponding first test mode signal among the plurality of first test mode signals is activated; and
a plurality of latch units operated by the second supply voltage, each configured to latch a corresponding second test mode signal among the plurality of second test mode signals.

10. The semiconductor device of claim 8, wherein the first supply voltage comprises a supply voltage having the first voltage level, the second supply voltage comprises a supply voltage having the second voltage level, and the second voltage level is higher than the first voltage level.

11. The semiconductor device of claim 8, wherein each of the latch units maintains the state of the corresponding second test mode signal even when the first supply voltage is deactivated.

12. The semiconductor device of claim 8, wherein each of the latch units deactivates the corresponding second test mode signal when the second supply voltage is deactivated.

13. The semiconductor device of claim 8, wherein the first test mode signal generation unit maintains all of the first test mode signals in an inactive state, when the setting signal is deactivated.

14. A semiconductor device comprising:
a mode register set circuit configured to set an operation mode of the semiconductor device in response to a command and address;
a test mode setting circuit configured to set a test mode corresponding to a test code among a plurality of test modes after the setting of the operation mode has been completed, and maintaining the set test mode even when a first supply voltage is deactivated to a voltage lower than the first supply voltage; and
an internal circuit configured to perform a predetermined operation corresponding to one or more test modes among the plurality of test modes, when the one or more test modes are set.

15. The semiconductor device of claim 14, wherein the setting of the operation mode is performed whenever the first supply voltage is deactivated, and the state of a test mode, which is set after setting of a first operation mode has been completed, is maintained until the setting of the operation mode is being performed after the first supply voltage is deactivated.

16. The semiconductor device of claim 14, wherein the test mode setting circuit comprises:
a test mode signal generation unit operated by the first supply voltage, and configured to activate a first test mode signal at a first voltage level in a state where the setting of the operation mode is being performed, the first test mode signal corresponding to a test code among a plurality of first test mode signals; and
a second test mode signal generation unit operated by a second supply voltage, configured to latch the first test mode signal at a second voltage level and generating the latched first test mode signal as a second test mode signal when a first supply voltage is deactivated.

17. The semiconductor device of claim 16, wherein the second test mode signal generation unit comprises:
a plurality of level shifters operated by the second supply voltage, each configured to generate a second test mode signal by shifting the level of a corresponding first test mode signal from the first voltage level to the second voltage level, when the corresponding first test mode signal among the plurality of first test mode signals is activated; and
a plurality of latch units operated by the second supply voltage, each configured to latch a corresponding second test mode signal among the plurality of second test mode signals.

18. The semiconductor device of claim 17, wherein the first supply voltage comprises a supply voltage having the first voltage level, the second supply voltage comprises a supply voltage having the second voltage level, and the second voltage level is higher than the first voltage level.

19. The semiconductor device of claim 18, wherein each of the latch units maintains the state of the corresponding second test mode signal even when the first supply voltage is deactivated, and
each of the latch units deactivates the corresponding second test mode signal when the second supply voltage is deactivated.

20. The semiconductor device of claim 14, wherein the test mode setting circuit cancels the set test mode when the second supply voltage is deactivated.

* * * * *